United States Patent [19]

McClure

[11] Patent Number: 5,377,143
[45] Date of Patent: Dec. 27, 1994

[54] MULTIPLEXING SENSE AMPLIFIER HAVING LEVEL SHIFTER CIRCUITS

[75] Inventor: David C. McClure, Carrollton, Tex.

[73] Assignee: SGS-Thomson Microelectronics, Inc., Carrollton, Tex.

[21] Appl. No.: 40,916

[22] Filed: Mar. 31, 1993

[51] Int. Cl.⁵ .................................. G11C 7/00
[52] U.S. Cl. .................. 365/189.02; 365/189.01; 365/189.11; 365/196; 365/202; 327/51
[58] Field of Search ............ 365/189.11, 230.08, 365/189.02; 307/530, 189.01, 196, 202, 189.11

[56] References Cited

U.S. PATENT DOCUMENTS 4,984,204  1/1991  Sato et al. .................. 365/189.11

Primary Examiner—Viet Q. Nguyen
Attorney, Agent, or Firm—Kenneth C. Hill; Lisa K. Jorgenson; Richard K. Robinson

[57] ABSTRACT

A memory system comprising a memory array having at least two pairs of data lines, first and second data lines corresponding to columns in the memory array. The memory array also includes two level shifter circuits, a first shifter circuit connected to the first lines and a second level shifter circuit connected to the second data lines, wherein the level shifter circuits produce output signals and may be enabled and disabled. A selection signal is used to selectively enable and disable the level shifter circuits, wherein one pair of data lines may be selected. An amplification circuit is connected to the level shifters for amplifying the output signals from the level shifter circuits, and a logic circuit is used to generate logic output signals in response to the amplified output signals from the amplification circuit.

32 Claims, 4 Drawing Sheets

MULTIPLEXING SENSE AMPLIFIER HAVING LEVEL SHIFTER CIRCUITS

CROSS-REFERENCE TO RELATED APPLICATION

The present application is related to U.S. patent application Ser. No. 08/041,321, entitled *"Multiplexing Sense Amplifier"* filed of even date herewith by the inventor hereof, assigned to the assignee herein, and incorporated herein by reference.

BACKGROUND OF THE INVENTION

1. Field of the Invention

The present invention relates generally to the field of microelectronics and in particular to a method and apparatus for sensing signals from a memory array. Still more particularly, the present invention relates to a method and apparatus for selecting and sensing signals from a memory array.

2. Description of the Prior Art

Memories are devices that respond to operational orders, usually from a central processing unit (CPU) of a digital computer. A sense amplifier is typically employed to detect attenuated signals from a memory array. Two types of sense amplifiers are typically used: a static sense amplifier and a dynamic sense amplifier. Dynamic sense amplifiers are often used because they have low current consumption and the sense amplifiers are activated only when required to perform sensing functions.

Referring to FIG. 1, a memory array 100, a multiplexer 102, and a sense amplifier 104 are depicted in a configuration known to those skilled in the art. Memory array 100 contains a number of bit line pairs that may be accessed using word lines (not shown). Frequently in memory arrays, such as memory array 100, sense amplifier 104 is shared among many columns of the memory array. In addition, the data fed into sense amplifier 104 might be multiplexed between different blocks of columns within memory array 100. In the depicted example, left block 100a and right block 100b of memory array 100 share sense amplifier 104. Two pairs of data lines, LBT, LBC, RBT, and RBC originate from memory array 100 and are connected to multiplexer 102. Data lines LBT and LBC originate from left block 100a of memory in memory array 100; data lines RBT and RBC originate from right block 100b in memory array 100. Data lines LBT and LBC carry left block true and complement data signals respectively, while data lines RBT and RBC carry right block true and complement data signals respectively. Multiplexer 102 is used to select data from one pair of data lines and is connected to sense amplifier 104. Sense amplifier 104 may include a number of different stages.

Referring next to FIG. 2, sense amplifier 104 may include the following stages: level shifter 106, current mirror 108, and p-channel cross-coupled amplifier 110. A level shifter is typically employed to shift the voltage of the multiplexed signals in order to optimize the other stages of the sense amplifier. Typically, level shifter 106 is used to adjust the voltage of the signal selected by multiplexer 102 in order to optimize the performance of the other stages within sense amplifier 104. Sense amplifier 104 is employed to detect signals, in lines MUXC and MUXT, selected by multiplexer 102 from memory array 100. Typically, sense amplifier 104 includes p-channel cross-coupled amplifier 110 with a high common-mode rejection in order to reject picked-up interference due to cross-talk from other parts of the system.

With reference now to FIG. 3, a schematic diagram of a known multiplexer is illustrated. The multiplexer is constructed with transistors MA-MM. The transistors are p-channel metal-oxide semiconductor field effect transistors (MOSFETs). Multiplexer 102 is powered by connecting transistors ME, MG, MH, MI, MJ, and ML to power supply VCC. Points 111, 113, and 115 are points at which an equalization signal is applied to multiplexer 102.

Data from data line LBT is fed into the multiplexer 102 at input point 112; data from the data line LBC is fed into multiplexer 102 at input point 114; data from data line RBT is fed into multiplexer 102 at input point 116; and data from data line RBC is fed into multiplexer 102 at input point 118.

The selection between the right block signals and the left block signals are made utilizing transistors MA, MB, MC, and MD. These transistors are p-channel MOSFETs. A low select signal into input point 120, connected to the gates of transistors MA and MB, turns on transistors MA and MB causing the selection of signals from data lines LBT and LBC to be selected and sent out at output points 122 and 124, as true complement signals in data lines MUXT and MUXC respectively. A low select signal into input point 126, which is connected to the gates of transistors MC and MD, causes the true signal in data line RBT to be sent to sense amplifier 104 via output 122 connected to line MUXT and the complement signal from data line RBC to be sent to sense amplifier 104 via output point 124 connected to line MUXC. The use of multiplexer 102 typically causes a signal drop. It is desirable to have as much signal as possible for speed and reliability.

More information on semiconductor memories and sense amplifiers may be found in the following references: Prince, *Semiconductor Memories*, John Wiley and Sons (2nd Ed. 1991) and Haznedar, *Digital Microelectronics*, The Benjamin/Cummings Publishing Company, Inc. (1991).

Therefore, it would be desirable to have a method and apparatus for multiplexing and sensing a data signal from a memory array without diminishing the data signal being sensed.

SUMMARY OF THE INVENTION

The present invention provides a memory system, including a memory array having at least two pairs of data lines, first and second data lines corresponding to columns in the memory array. The memory array also includes two level shifter circuits, a first shifter circuit connected to the first lines and a second level shifter circuit connected to the second data lines, wherein the level shifter circuits produce output signals and may be enabled and disabled. A selection signal is used to selectively enable and disable the level shifter circuits, wherein one pair of data lines may be selected. An amplification circuit is connected to the level shifters for amplifying the output signals from the level shifter circuits, and a logic circuit is used to generate logic output signals in response to the amplified output signals from the amplification circuit.

The present invention also includes a multiplexing sense amplifier circuit for use with a memory array, which includes a level shifter stage having two level shifter circuits, a first level shifter circuit connected to a first input line and a first complement input line and a second level shifter circuit connected to a second input line and a second complement input line. Each level shifter circuit has two outputs, a true output and a complement output, and a select input. The level shifter circuits are responsive to a select signal, for enabling or disabling the level shifter circuit. The first level shifter circuit is disabled when the second level shifter circuit is enabled, and the first level shifter circuit is enabled when the second level shifter circuit is disabled, providing selection of signals from one of the two level shifter circuits.

The multiplexing sense amplifier circuit also has a second stage having a true output and a complement output, the second stage being connected to the true and complement outputs of the level shifter stage, wherein the true output and the complement output of the second stage is controlled by the outputs of the level shifter. An amplifier stage or logic circuit may be connected to the true output and the complement output of the second stage. The amplifier has a pair of outputs, wherein the amplifier generates logic 1 and logic 0 signals at the pair of outputs in the amplifier stage in response to signals from the true output and complement output of the second stage. Alternatively, the output of the second stage may be used without the amplifier or logic circuit.

The second stage of the multiplexing sense amplifier may include a pair of current mirrors. Other circuits that may be used in the second stage of the multiplexing sense amplifier include, for example, a p-channel cross-coupled amplifier, a differential amplifier, or a level shifter.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
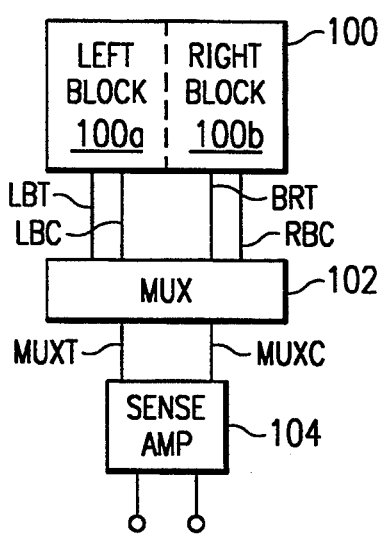
FIG. 1 is a block diagram of a portion of a memory system illustrating a configuration of a memory array, a multiplexer, and a sense amplifier known in the prior art.
Figure 2:
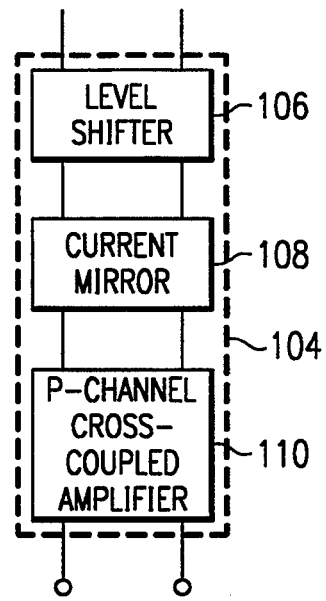
FIG. 2 is a block diagram of a sense amplifier known in the prior art.
Figure 3:
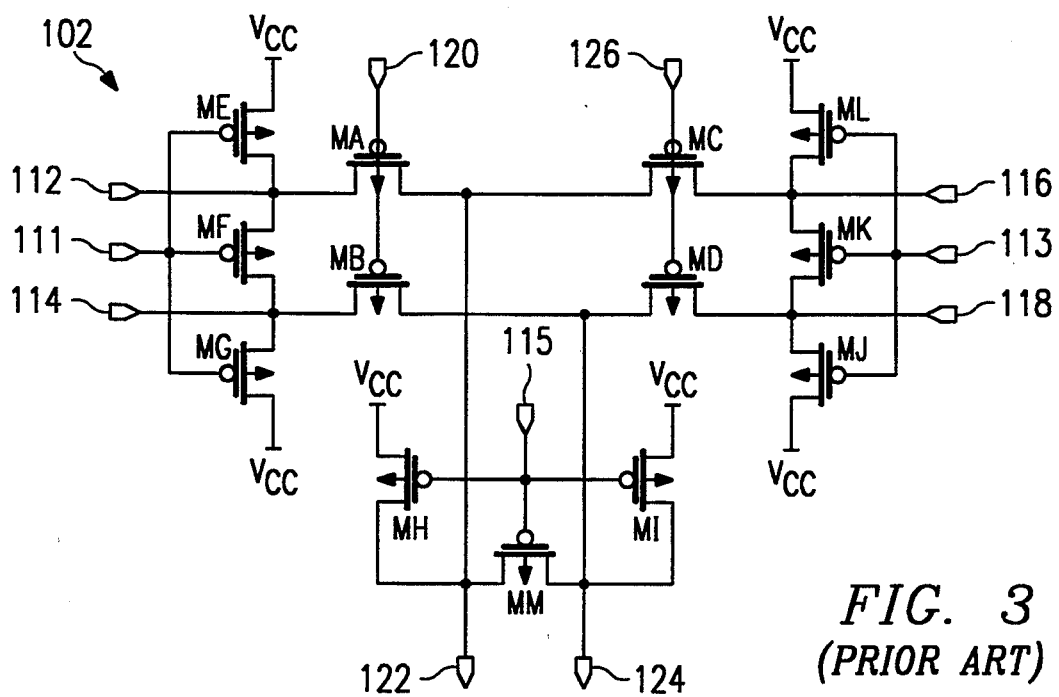
FIG. 3 is a schematic diagram of a multiplexer known in the prior art.

In accordance with a preferred embodiment of the present invention, the multiplexing function is incorporated into the sense amplifier in order to reduce the effects of having a separate multiplexer selecting signals as illustrated in the prior art design in FIG. 1.

Figure 4:
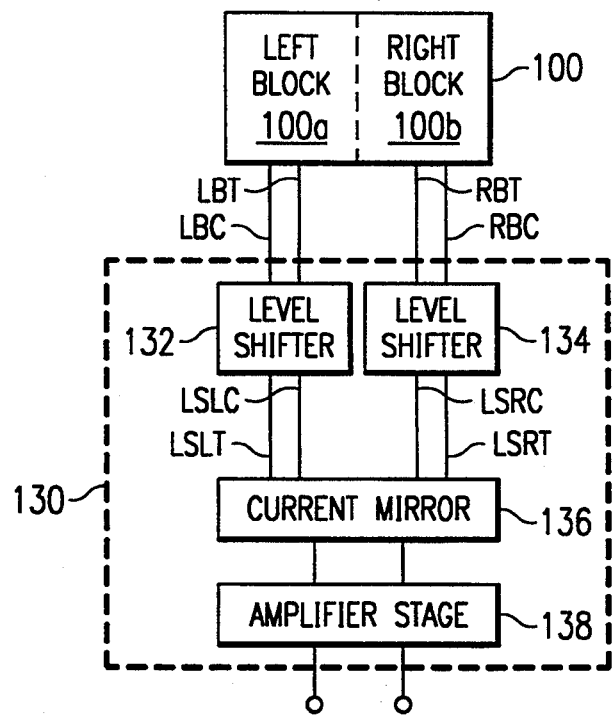
FIG. 4 is a block diagram of a portion of a memory system configured according to the present invention.

Referring now to FIG. 4, a block diagram of a portion of a memory system configured according to the present invention is illustrated. Memory array 100 again includes left block 100a and right block 100b. Signals from data lines LBT, LBC, RBC, and RBT are fed directly into sense amplifier 130 instead of a multiplexer. Signals from data lines LBT and RBT are true signals, while signals from data lines LBC and RBC are complement signals. In accordance with a preferred embodiment of the present invention, sense amplifier 130 includes level shifter 132, level shifter 134, current mirror stage 136, and amplifier stage 138. Multiplexing functions are incorporated into level shifters 132 and 134 in accordance with a preferred embodiment of the present invention.

Figure 5:
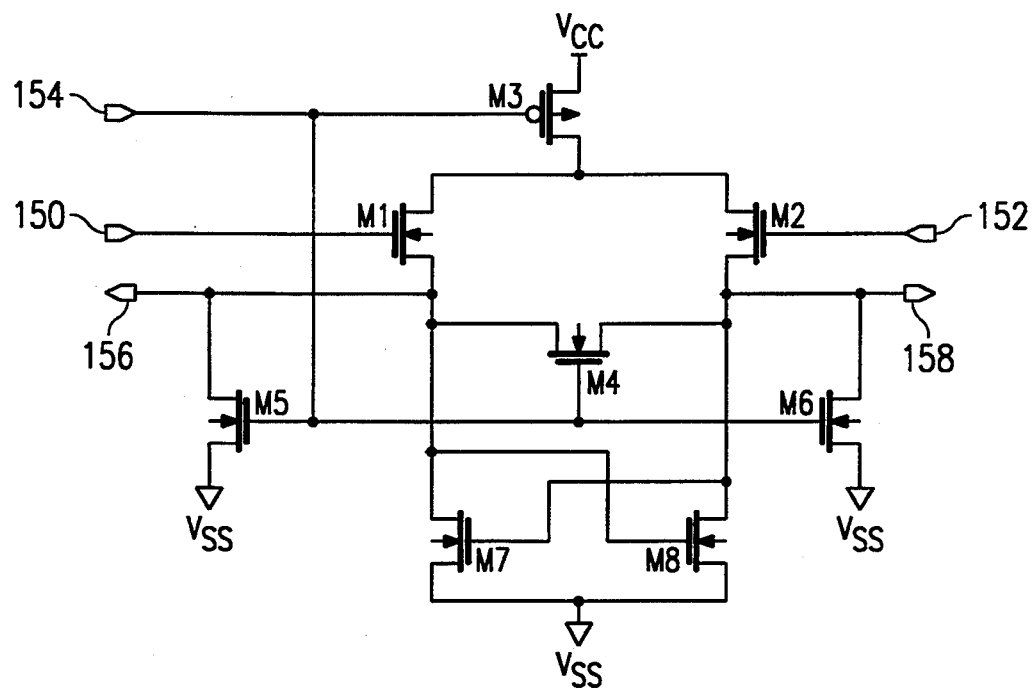
FIG. 5 is a schematic diagram of a cross-coupled level shifter according to the present invention.

Referring now to FIG. 5, a schematic diagram of a cross-coupled level shifter according to the present invention is depicted. Transistors M1–M8 comprise the cross-coupled level shifter. These transistors are n-channel and p-channel MOSFETs. Transistors M1, M2, M4–M8 are n-channel MOSFETs, and transistor M3 is a p-channel MOSFET in accordance with the preferred embodiment of the present invention. Input points 150 and 152 receive either signals from data lines LBT and LBC, or signals from data lines RBT and RBC, respectively. These signals control the gates of transistors M1 and M2 respectively. Transistors M7 and M8 are shown in a cross-coupled connection. Other configurations may be used, such as, tying the drain of each transistor, M7 and M8, to the transistor's own gate or by tying the gates to a bias voltage. The drain of transistor M3 is connected to power supply VCC, and the sources of transistors M5–M8 are connected to power supply VSS. These connections provide power to operate the circuit. Power supply VCC is at a higher voltage relative to power supply VSS.

The level shifter incorporates a multiplexing function in accordance with a preferred embodiment of the present invention. This multiplexing function is controlled by a select signal at input point 154 in level shifters 132 and 134. The select signal controls the gate of transistor M3. If the gate of transistor M3 is turned on, the level shifter allows the passage of the true and complement signals through output points 156 and 158 respectively. A high signal at input point 154 disables the level shifter, forcing the output at output points 156 and 158 to be low. On the other hand, when the signal at input point 154 is low, the level shifter performs normally in accordance with a preferred embodiment of the present invention.

By selecting only one of the two level shifters, 132 or 134, as depicted in FIG. 4, a 2 to 1 multiplexing of the signals from the memory array is achieved without diminishing signal strength in accordance with a preferred embodiment of the present invention. The output from output point 156 is a signal LSLT in level shifter 132 and a signal LSRT, right block true signal, in level shifter 134; the output from output point 158 is a signal LSLC, left block complement signal, in level shifter 132 and a signal LSRC, right block complement signal, in level shifter 134. In accordance with a preferred embodiment of the present invention, more than two level shifters may be used depending on the design of the memory system.

Figure 6:
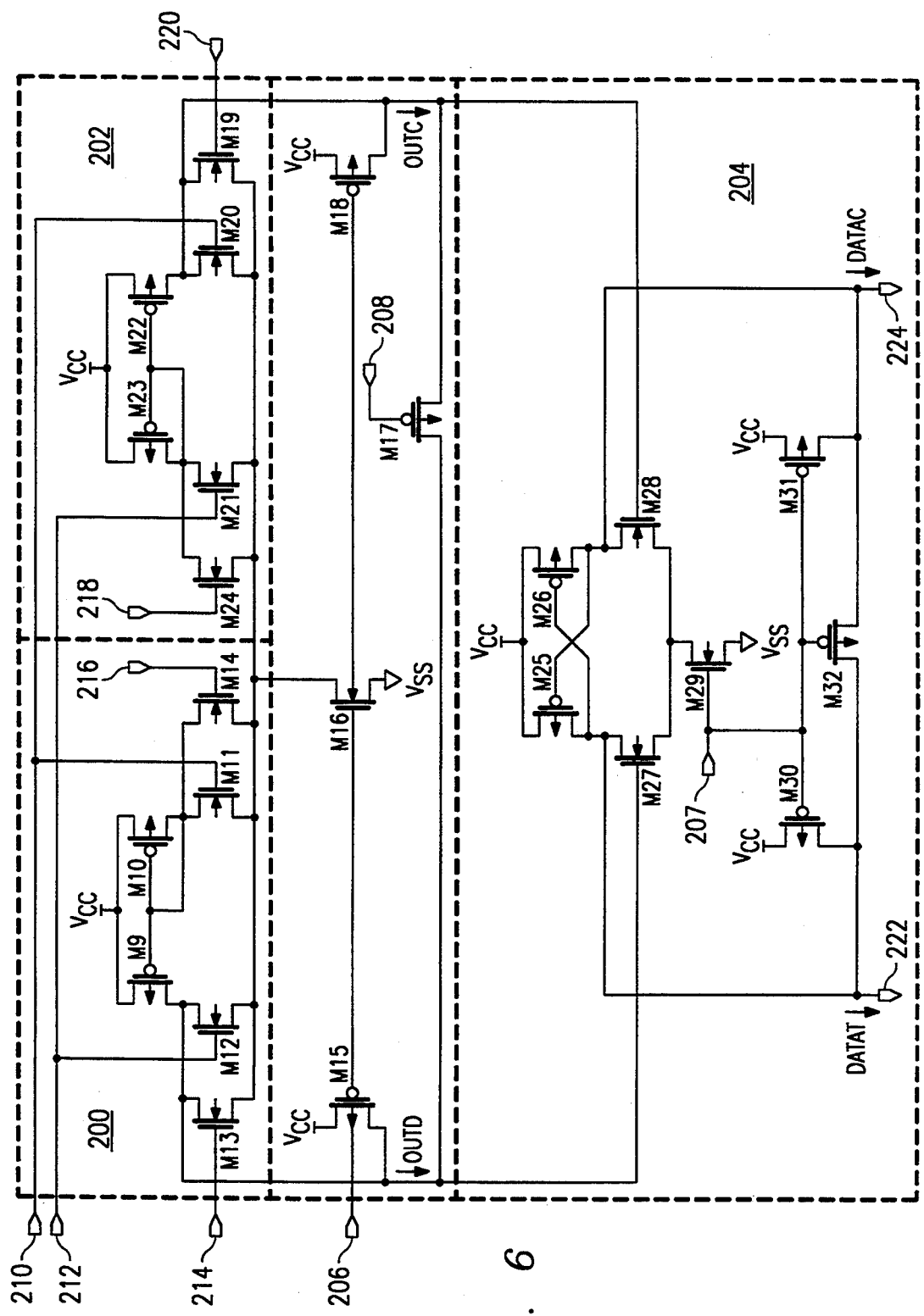
FIG. 6 is a schematic diagram of a pair of current mirrors and a p-channel cross-coupled amplifier according the present invention.

Next, FIG. 6 illustrates a schematic diagram of a pair of current mirrors and a p-channel cross-coupled amplifier within a sense amplifier in accordance with a preferred embodiment of the present invention. Current mirror stage 136 includes current mirrors 200 and 202. Current mirror 200 is constructed from transistors M9–M14; current mirror 202 is constructed from transistors M19–M24. Transistors M9, M10, M22, and M23 are p-channel MOSFETs while the rest of the transistors in the two current mirrors are n-channel MOSFETs in accordance with the preferred embodiment of the present invention. P-channel cross-coupled amplifier 204 is constructed from transistors M25–M32. Transistors M25, M26, M30, M31, and M32, are p-channel transistors, while transistors M27, M28, and M29 are n-channel transistors in p-channel cross-coupled amplifier 204. Transistors M25–M28 form a flip-flop in this circuit. Transistor M32 is employed to provide balancing within the circuit, and transistors M30 and M31 are utilized to pre-charge the circuit.

Transistors M15–M18 are employed to enable, disable, and pre-charge the sense amplifier in accordance with a preferred embodiment of the present invention. The current mirrors and the amplifier are powered by connecting the drains of transistors M9, M10, M15, M18, M22, M23, M25, M26, M30, and M31 to power supply VCC, while the sources of transistors M16, and M29 are connected to power supply VSS. Power supply VCC is typically at a higher voltage than power supply VSS.

Signals at input points 206, 207, and 208 enable and disable the circuits. Input points 210 and 212 carry signals LSRC and LSRT from level shifter 134 while input points 214 and 218 carry signal LSLC from level shifter 132. Input points 216 and 220 carry signal LSRT from level shifter 132. Signal LSRC controls the gates of transistors M11 and M20; signal LSRT controls the gates of transistors M12 and M21. Transistors M13 and M24 are controlled by signal LSLT; transistors M14 and M19 are controlled by signal LSLC.

In accordance with a preferred embodiment of the present invention, current mirrors 200 and 202 are current mirrors with additional transistors added in parallel to control the output of the current mirrors. Transistors M12 and M13 are connected in parallel; transistors M11 and M14 are in parallel; transistors M21 and M24 are connected in parallel; and transistors M20 and M19 are connected in parallel. These transistors control the current flow in the current mirrors.

If level shifter 134 is not selected and level shifter 132 has been selected, the signals at input points 210 and 212 are low. A low signal is a signal that turns the transistor off. As a result, transistors M11, M12, M20, and M21 are turned off. The signals at input points 214, 216, 218 and 220 correspond to the output from level shifter 132, resulting in various levels of current flowing through transistors M13, M14, M24, and M19 depending on the voltage at the gates of transistors by signals supplied by lines LSLT and LSLC. The output signals, OUTT and OUTC, from these two current mirrors control the gates of transistors M27 and M28 in p-channel cross-coupled amplifier 204 resulting in output signals DATAT and DATAC at output points 222 and 224 respectively. Signal DATAC is the complement of signal DATAT.

Figure 7:
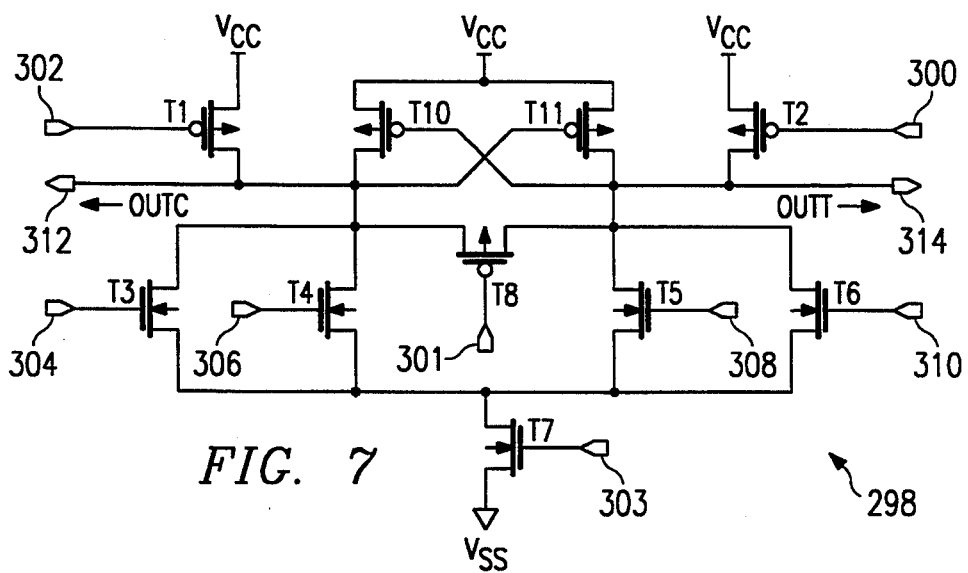
FIG. 7 is a schematic diagram of a p-channel cross-coupled amplifier according to the present invention.

Current mirror stage 136 in FIG. 4 may be replaced by a number of different stages in accordance with a preferred embodiment of the present invention. For example, a p-channel cross-coupled amplifier 298, as depicted in FIG. 7, may be utilized in place of the two current mirrors 200 and 202 illustrated in FIG. 6. P-channel cross-coupled amplifier 298 is constructed from transistors T1–T11. Transistors T1, T2, T8, T10, and T11 are p-channel MOSFETs. The remaining transistors are n-channel MOSFETs. P-channel cross-coupled amplifier 298 is powered by connecting transistors T1, T2, T10, and T11 to power supply VCC and connecting the drain of transistor T7 to power supply VSS.

P-channel cross-coupled amplifier 298 is enabled when a select signal is high at input points 300, 301, 302, and 303. These signals control the gates of transistors T1, T2, T7, and T8. Input points 304 and 306 are connected to the gates of transistors T3 and T4 respectively; input points 308 and 310 are connected to the gates of transistors T5 and T6 respectively. Again, a parallel configuration of transistor T3 in parallel with transistor T4 and transistor T5 in parallel with transistor T6 is employed in accordance with a preferred embodiment of the present invention. Signal LSLT enters input point 304; signal LSRT enters input point 306; signal LSRC enters input point 308; and signal LSLC enters input point 310. If level shifter 134 is disabled and level shifter 132 is selected, signals LSRT and LSRC will be low, causing transistors T4 and T5 to be turned off. Signals LSLT and LSLC will correspond to the output from level shifter 132, allowing various amounts of current to flow through transistors T3 and T6 in response to different voltages being applied to the gates of these two transistors in accordance with a preferred embodiment of the present invention.

Transistors T10 and T11 are the cross-coupled p-channel MOSFETs within the amplifier. Signal OUTC travels from output point 312 to transistor M28 in amplifier 204 in FIG. 6. Signal OUTT travels from output point 314 to transistor M27 in amplifier 204 in FIG. 6. The depicted embodiment in FIG. 6 illustrates employing an amplifier connected to the current mirrors to produce a logic signal. According to the present invention, some other logic circuit may be used in place of amplifier 204. Furthermore, the circuit below current mirrors 200 and 202 may be eliminated, and the output from current mirrors 200 and 202 may be directly used as the output of the sense amplifier.

Figure 8:
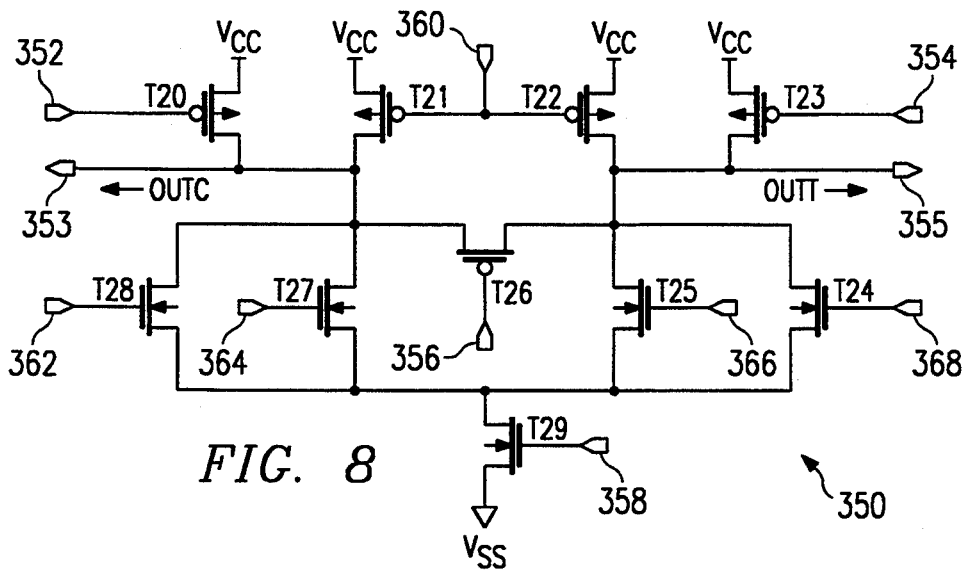
FIG. 8 is a schematic diagram of a differential amplifier according to the present invention.

Referring now to FIG. 8, a schematic diagram of a differential amplifier, which may be substituted in place of current mirrors 200 and 202 in FIG. 6, is illustrated in accordance with a preferred embodiment of the present invention. Differential amplifier 350 is comprised of transistors T20–T29. Transistors T20–T23 and T26 are p-channel MOSFETs while the remaining transistors are n-channel MOSFETs. This circuit is powered by connecting the drains of transistors T20, T21, T22, and T23 to power supply VCC and connecting the source of transistor T29 to power supply VSS.

Transistors T20, T23, T26 and T29 enable and disable differential amplifier 350. These transistors are controlled by control signals at input points 352, 354, 356, and 358. A bias signal (or ground) is applied to the amplifier at input point 360, which controls the gates of transistors T21 and T22. Transistor T28 is controlled by signal LSLT at input point 362. Transistor T27 is controlled by signal LSRT at input point 364. Transistor T25 is controlled by signal LSRC at input point 366. Transistor T24 is controlled by signal LSLC at input point 368. Output point 353 is connected to the gate of transistor M28 in amplifier 204 and provides a complement output signal OUTC, while output point 355 is connected to the gate of transistor M27 in amplifier 204 and provides an output signal, OUTT.

Figure 9:
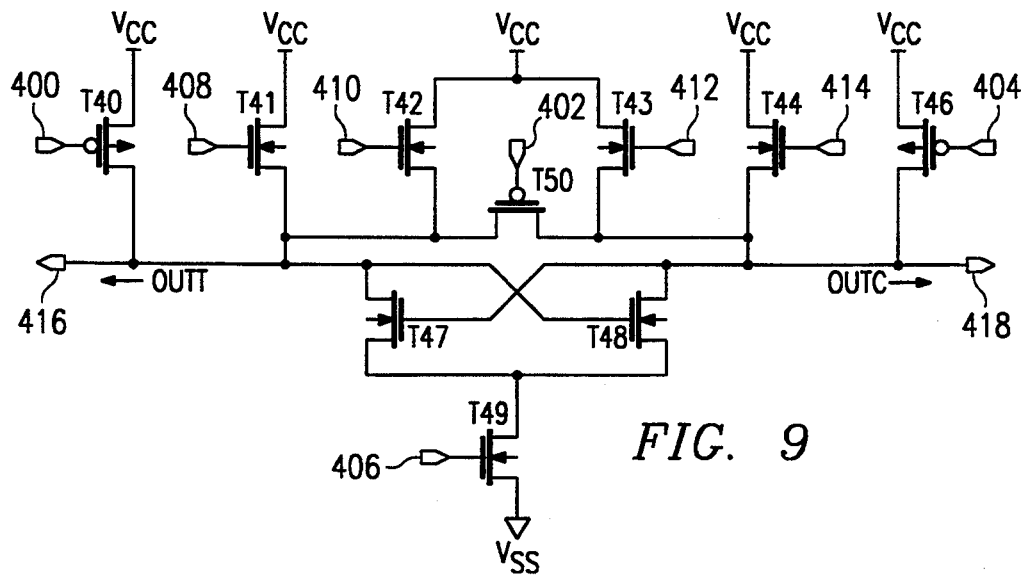
FIG. 9 is a schematic diagram of a level shifter according to the present invention.

Referring now to FIG. 9, transistors T40-T50 are utilized to form a level shifter that may be utilized in place of current mirrors 200 and 202 in FIG. 6. Transistors T40, T46, and T50 are p-channel MOSFETs, while transistors T41, T42, T43, T44, T47, T48, and T49 are n-channel MOSFETs in accordance with a preferred embodiment of the present invention. Transistors T40, T46, T49, and T50 are employed to enable and disable the circuit. Control signals at input points 400, 402, 404, and 406 control the gates of these transistors. The circuit is powered by connecting the drains of transistors T40, T41, T44, and T46 to power supply VCC, while connecting the source of transistor T49 to power supply VSS.

Transistor T41 is controlled by signal LSLT applied to input point 408. Transistor T42 is controlled by signal LSRT applied to input point 410; transistor T43 is controlled by signal LSRC applied to input point 412; and transistor T44 is controlled by signal LSLC applied to input point 414. Transistors T41 and T42 are in parallel; transistors T43 and T44 are in parallel. Output point 416 is connected to the gate of transistor M27 in amplifier 204 in FIG. 6. Output point 418 is connected to the gate of transistor M28 in amplifier 204 is FIG. 6. The output signals at output points 416 and 418 are determined by the input signals at input points 408, 410, 412, and 414. For example, if level shifter 134 is disabled and level shifter 132 is selected, transistors T41 and T44 would be turned on, while transistors T42 and T43 would be turned off. The output at output point 416 would depend on signal LSLT at input point 408, which controls transistor T41. The output at output point 418 would depend on signal LSLC at input point 414, controlling transistor T44.

The present invention allows for selection of signals by enabling and disabling a pair of level shifters, instead of using a separate multiplexer. Transistors controlling the output in later stages are placed in parallel and controlled by the output signals from the level shifters. Although, two level shifters are depicted, other numbers of level shifters may be utilized in different memory array configurations. Although the depicted embodiment illustrates the selection of signals by enabling and disabling a pair of level shifters, other circuits other than level shifters may be manipulated in a similar function within a sense amplifier to provide selection of signals.

In addition, the depicted embodiment illustrates an implementation involving pairs of data lines, carrying true and complement signals. Those of ordinary skill in the art will appreciate that a single data line implementation, instead of a pair of data lines, may be employed according to the present invention. A differential amplifier may be used to produce a true and complement signal from a single data line.

One advantage of the present invention is that it provides a faster and more sensitive sense amplifier because signal losses resulting from signals propagating through a transmission gate in a multiplexer stage are eliminated. Additionally, the present invention provides for smaller and simpler circuitry for selecting and sensing signals from data lines in multiple blocks of memory. The present invention is depicted using MOS technology. Other types of technology and transistors may be utilized in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A multiplexing sense amplifier circuit for use with a memory array comprising:

a first, level shifter, stage circuit having at least two level shifter circuits, a first level shifter circuit connected to a first input line and a first complement input line and a second level shifter circuit connected to a second input line and a second complement input line, the first level shifter circuit having two outputs, a true output and a complement output, and a select input, responsive to a select signal, for enabling or disabling the first level shifter circuit, the second level shifter circuit having two outputs, a true output and a complement output, and a select input, responsive to a select signal, for enabling or disabling the second level shifter circuit, wherein the first level shifter circuit is disabled when the second level shifter circuit is enabled and the first level shifter circuit is enabled when the second level shifter circuit is disabled and wherein selection of signals from one of the two level shifter circuits may be accomplished; and a second stage circuit having a true output and a complement output, the second stage circuit being connected to the true and complement outputs of the level shifter stage circuit, wherein the true output and the complement output of the second stage circuit are controlled by the outputs of the level shifter stage circuit.

2. The multiplexing sense amplifier circuit of claim 1 further comprising:

an amplifier stage circuit connected to the true output and the complement output of the second stage circuit, the amplifier stage circuit having a pair of outputs, wherein the amplifier stage circuit generates logic 1 and logic 0 signals at the pair of outputs in the amplifier stage circuit in response to signals from the true output and complement output of the second stage circuit.

3. A multiplexing sense amplifier circuit for use with a memory array comprising:

a level shifter stage circuit having at least two level shifter circuits, a first level shifter circuit connected to a first input line and a first complement input line and a second level shifter circuit connected to a second input line and a second complement input line, the first level shifter circuit having two outputs, a true output and a complement output, and a select input, responsive to a select signal, for enabling or disabling the first level shifter circuit, the second level shifter circuit having two outputs, a true output and a complement output, and a select input, responsive to a select signal, for enabling or disabling the second level shifter circuit, wherein the first level shifter circuit is disabled when the second level shifter circuit is enabled and the first level shifter circuit is enabled when the second level shifter circuit is disabled and wherein selection of signals from one of the two level shifter circuits may be accomplished;

a second stage circuit having a true output and a complement output, the second stage circuit being connected to the true and complement outputs of the level shifter stage circuit, wherein the true output and the complement output of the second stage circuit are controlled by the outputs of the level shifter stage circuit; and an amplifier stage circuit connected to the true output and the complement output of the second stage circuit, the amplifier stage circuit having a pair of outputs, wherein the amplifier stage circuit generates logic 1 and logic 0 signals at the pair of outputs in the amplifier stage circuit in response to signals from the true output and complement output of the second stage circuit, wherein said second stage circuit comprises a first pair of transistors and a second pair of transistors, each pair of transistors having a first transistor connected in parallel with a second transistor in the pair, the gate of the first transistor in the first pair being connected to the true output of the first level shifter circuit, the gate of the second transistor in the first pair being connected to the true output of the second level shifter circuit, the gate of the first transistor in the second pair being connected to the complement output of the first level shifter circuit, and the gate of the second transistor in the second pair being connected to the complement output of the second level shifter circuit, wherein the two pairs of transistors control the true output and the complement output of the second stage circuit.

4. The multiplexing sense amplifier of claim 2, wherein the amplifier stage circuit is a p-channel cross-coupled amplifier comprising two p-channel metal-oxide field effect transistors, each p-channel metal-oxide transistor having a gate connected to a drain of the other p-channel metal-oxide field effect transistor, and two n-channel metal-oxide field effect transistors, each n-channel metal-oxide field effect transistor having a drain connected to the drain of a respective p-channel metal-oxide field effect transistor, wherein the true output of the second stage circuit is connected to the gate of the first n-channel metal-oxide field effect transistor and the complement output of the second stage circuit is connected to the gate of the second n-channel metal-oxide field effect transistor.

5. The multiplexing sense amplifier of claim 3, wherein the second stage circuit comprises a pair of current mirrors, a first current mirror and a second current mirror, the first current mirror having an output controlled by the outputs of the first and second level shifter circuits and the second current mirror having an output controlled by the outputs of the first and second level shifter circuits.

6. The multiplexing sense amplifier of claim 5, wherein each current mirror includes four control transistors for controlling the current output of the current mirror.

7. The multiplexing sense amplifier of claim 6, wherein the first control transistor has its gate connected to the true output of the first level shifter circuit, the second control transistor is connected in parallel with the first control transistor and has its gate connected to the true output of the second level shifter circuit, the third control transistor has a gate connected to the complement output of the first level shifter circuit, and the fourth control transistor is connected in parallel with the third control transistor and has a gate connected to the complement output of the second level shifter circuit.

8. The multiplexing sense amplifier of claim 2, wherein said second stage circuit comprises a cross-coupled amplifier having a pair of control transistors for controlling the output of the second stage circuit and wherein the the pair is of control transistors controlled by the outputs from the from two level shifter circuits.

9. The multiplexing sense amplifier of claim 8, wherein a first control transistor in the pair is connected in parallel with the second control transistors in the pair and wherein the first control transistor is controlled by the outputs of the first level shifter circuit and the second control transistor is controlled by the outputs of the second level shifter circuit.

10. The multiplexing sense amplifier of claim 9, wherein said cross-coupled amplifier is a p-channel cross-coupled amplifier.

11. The multiplexing sense amplifier of claim 3, wherein the second stage circuit comprises a differential amplifier having two pairs of transistors for controlling the output of the second stage circuit and wherein the two pairs are controlled by the outputs from the two level shifter circuits.

12. The multiplexing sense amplifier of claim 11, wherein each transistor in the first pair is connected in parallel with one of the transistor in the second pair and wherein the first pair is controlled by the outputs of the first level shifter circuit and the second pair is controlled by the outputs of the second level shifter circuit.

13. The multiplexing sense amplifier of claim 3, wherein the second stage circuit comprises a level shifter circuit having two pairs of transistors controlling the output of the second stage circuit.

14. The multiplexing sense amplifier of claim 13, wherein each transistor in the first pair is connected in parallel with one of the transistor in the second pair and wherein the first pair is controlled by the outputs of the first level shifter circuit and the second pair is controlled by the outputs of the second level shifter circuit.

15. The multiplexing sense amplifier of claim 1, wherein the first level shifter circuit in the level shifter stage circuit is disabled by disconnecting a power supply connection to VCC from the first level shifter circuit and the second level shifter circuit in the level shifter stage circuit is disabled by disconnecting a power supply connection to VCC from the second level shifter circuit.

16. The multiplexing sense amplifier of claim 1, wherein both outputs of the first level shifter circuit are forced low in response to disablement of the first level shifter circuit and both outputs of the second level shifter circuit are forced low in response to disablement of second the level shifter circuit.

17. A multiplexing sense amplifier circuit for use with a memory array comprising:

a first stage circuit having at least two circuits, a first circuit connected to a first input line and a first complement input line and a second circuit connected to a second input line and a second complement input line, the first circuit having two outputs, a true output and a complement output, and a select input, responsive to a select signal, for enabling or disabling the first circuit, the second circuit having two outputs, a true output and a complement output, and a select input, responsive to a select signal, for enabling or disabling the second circuit, wherein the first circuit is disabled when the second circuit is enabled and the first circuit is enabled when the second circuit is disabled and wherein selection of signals from one of the two circuits may be accomplished; and a second stage circuit having a true output and a complement output, the second stage circuit being connected to the true and complement outputs of the first stage circuit, wherein the true output and the complement output of the second stage circuit are controlled by the outputs of the first stage circuit.

18. The multiplexing sense amplifier circuit of claim 17 further comprising:

an amplifier stage circuit connected to the true output and the complement output of the second stage circuit, the stage amplifier circuit having a pair of outputs, wherein the amplifier stage circuit generates logic 1 and logic 0 signals at the pair of outputs in the amplifier stage circuit in response to signals from the true output and complement output of the second stage circuit.

19. A multiplexing sense amplifier circuit for use with a memory array comprising:

a first stage circuit having at least two circuits, a first circuit connected to a first input line and a first complement input line and a second circuit connected to a second input line and a second complement input line, the first circuit having two outputs, a true output and a complement output, and a select input, responsive to a select signal, for enabling or disabling the first circuit, the second circuit having two outputs, a true output and a complement output, and a select input, responsive to a select signal, for enabling or disabling the second circuit, wherein the first circuit is disabled when the second circuit is enabled and the first circuit is enabled when the second circuit is disabled and wherein selection of signals from one of the two circuits may be accomplished;

a second stage circuit having a true output and a complement output, the second stage circuit being connected to the true and complement outputs of the first stage circuit, wherein the true output and the complement output of the second stage circuit are controlled by the outputs of the first stage circuit; and an amplifier stage circuit connected to the true output and the complement output of the second stage circuit, the stage amplifier having a pair of outputs, wherein the amplifier stage circuit generates logic 1 and logic 0 signals at the pair of outputs in the amplifier stage circuit in response to signals from the true output and complement output of the second stage circuit;

wherein said second stage circuit comprises a first pair of transistors and a second pair of transistors, each pair of transistors having a first transistor connected in parallel with a second transistor in the pair, the gate of the first transistor in the first pair being connected to the true output of the first circuit, the gate of the second transistor in the first pair being connected to the true output of the second circuit, the gate of the first transistor in the second pair being connected to the complement output of the first circuit, and the gate of the second transistor in the second pair being connected to the complement output of the second circuit, wherein the two pairs of transistors control the true output and the complement output of the second stage circuit.

20. The multiplexing sense amplifier of claim 18, wherein the amplifier stage circuit is a p-channel cross-coupled amplifier comprising two p-channel metal-oxide field effect transistors, each p-channel metal-oxide transistor having a gate connected to a drain of the other p-channel metal-oxide field effect transistor, and two n-channel metal-oxide field effect transistors, each n-channel metal-oxide field effect transistor having a drain connected to the drain of a p-channel metal-oxide field effect transistor, wherein the true output of the second stage circuit is connected to the gate of the first n-channel metal-oxide field effect transistor and the complement output of the second stage is connected to the gate of the second n-channel metal-oxide field effect transistor.

21. The multiplexing sense amplifier of claim 19, wherein the second stage circuit comprises a pair of current mirrors, a first current mirror and a second current mirror, the first current mirror having an output controlled by the outputs of the first and second circuits and the second current mirror having an output controlled by the outputs of the first and second circuits in the first stage circuit.

22. The multiplexing sense amplifier of claim 21, wherein the first current mirror includes four control transistors for controlling the current output of the first current mirror and the second current mirror includes four control transistors for controlling the current output of the second current mirror.

23. The multiplexing sense amplifier of claim 22, wherein the first control transistor has its gate connected to the true output of the first circuit, the second control transistor is connected in parallel with the first control transistor and has its gate connected to the true output of the second circuit, the third control transistor has a gate connected to the complement output of the first circuit, and the fourth control transistor is connected in parallel with the third control transistor and has a gate connected to the complement output of the second circuit.

24. The multiplexing sense amplifier of claim 18, wherein said second stage circuit comprises a cross-coupled amplifier having two pairs of control transistors for controlling the output of the second stage and wherein the two pairs are controlled by the outputs from the from two circuits.

25. The multiplexing sense amplifier of claim 24, wherein each control transistor in the first pair is connected in parallel with one of the control transistor in the second pair and wherein the first pair is controlled by the outputs of the first circuit and the second pair is controlled by the outputs of the second circuit.

26. The multiplexing sense amplifier of claim 25, wherein said cross-coupled amplifier is a p-channel cross-coupled amplifier.

27. The multiplexing sense amplifier of claim 19, wherein the second stage circuit comprises a differential amplifier having two pairs of transistors controlling the output of the second stage circuit and wherein the two pairs are controlled by the outputs from the the first and second circuits in the first stage circuit.

28. The multiplexing sense amplifier of claim 27, wherein each transistor in the first pair is connected in parallel with one of the transistor in the second pair and wherein the first pair is controlled by the outputs of the first circuit and the second pair is controlled by the outputs of the second circuit.

29. The multiplexing sense amplifier of claim 19, wherein the second stage circuit comprises a level shifter circuit having two pairs of transistors controlling the output of the second stage.

30. The multiplexing sense amplifier of claim 29, wherein each transistor in the first pair is connected in parallel with one of the transistor in the second pair and wherein the first pair is controlled by the outputs of the first circuit and the second pair is controlled by the outputs of the second circuit.

31. The multiplexing sense amplifier of claim 17, wherein the first level shifter circuit in the level shifter stage circuit is disabled by disconnecting a power supply connection to VCC from the second level shifter circuit and the second level shifter circuit in the level shifter stage circuit is disabled by disconnecting a power supply connection to the VCC from the second level shifter circuit.

32. The multiplexing sense amplifier of claim 17, wherein both outputs of the first level shifter circuit are forced low in response to disablement of the first level shifter circuit and the second level shifter circuit are forced low in response to disablement of the second level shifter circuit.

* * * * *

UNITED STATES PATENT AND TRADEMARK OFFICE
CERTIFICATE OF CORRECTION

PATENT NO. : 5,377,143
DATED : December 27, 1994
INVENTOR(S) : David C. McClure

It is certified that error appears in the above-identified patent and that said Letters Patent is hereby corrected as shown below:

In column 5, line 34, change "LSLC" to --LSLT--.

In column 5, line 35, change "LSRT" to --LSLC--.

Signed and Sealed this

Eleventh Day of July, 1995

Attest:

BRUCE LEHMAN

*Attesting Officer*    *Commissioner of Patents and Trademarks*